(12) United States Patent
Kinoshita (10) Patent No.: US 7,848,639 B2
(45) Date of Patent: Dec. 7, 2010

(54) SOLID-STATE IMAGE SENSING DEVICE AND ELECTRONIC APPARATUS COMPRISING SAME

(75) Inventor: Kazuo Kinoshita, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 247 days.

(21) Appl. No.: 12/150,231

(22) Filed: Apr. 24, 2008

(65) Prior Publication Data

US 2008/0267616 A1      Oct. 30, 2008

(30) Foreign Application Priority Data

Apr. 27, 2007   (JP)   ............................. 2007-120199

(51) Int. Cl.
   *G03B 17/02* (2006.01)
(52) U.S. Cl. ..................................... 396/535
(58) Field of Classification Search .............. 396/518, 396/529, 535, 541, 542
   See application file for complete search history.

(56) References Cited

U.S. PATENT DOCUMENTS

| | | | |
|---|---|---|---|
| 5,768,038 A | 6/1998 | Emura | |
| 6,085,039 A | 7/2000 | Hamada et al. | |
| 2004/0095499 A1 | 5/2004 | Ning | |
| 2004/0189854 A1 | 9/2004 | Tsukamoto et al. | |
| 2004/0207745 A1 | 10/2004 | Tsuruta et al. | |
| 2005/0152050 A1* | 7/2005 | Noda et al. | 359/819 |
| 2006/0132936 A1 | 6/2006 | Yu | |
| 2006/0153556 A1 | 7/2006 | Lee et al. | |
| 2006/0219884 A1* | 10/2006 | Tsukamoto et al. | 250/239 |
| 2006/0219885 A1* | 10/2006 | Kinoshita et al. | 250/239 |
| 2006/0221225 A1* | 10/2006 | Tsukamoto et al. | 348/340 |
| 2007/0030334 A1* | 2/2007 | Nishizawa | 347/245 |
| 2007/0053082 A1 | 3/2007 | Sue et al. | |
| 2008/0212959 A1 | 9/2008 | Shin et al. | |

FOREIGN PATENT DOCUMENTS

| | | |
|---|---|---|
| CN | 1790149 A | 6/2006 |
| JP | 04-050906 A | 2/1992 |

(Continued)

OTHER PUBLICATIONS

Co-pending U.S. Utility Application, filed Apr. 24, 2008, entitled, "Optical Unit, Solid-State Image Sensing Device and Electronic Apparatus Comprising Same,".

*Primary Examiner*—W. B. Perkey
*Assistant Examiner*—Dennis Hancock
(74) *Attorney, Agent, or Firm*—Edwards Angell Palmer & Dodge LLP; David G. Conlin; Catherine J. Toppin (57) ABSTRACT

A camera module 100*a* includes a lens unit 1*a* which includes a lens 11 and a lens holder 12 holding the lens 11 therein, and an image sensing unit 2*a* which includes a solid-state image sensor 24 and a transparent lid section 26 which is arranged so as to face the receiving surface of the solid-state image sensor 24, provided with a space S therebetween. The lens holder 12 blocks unnecessary light to the transparent lid section 26 by engaging the lens holder 12 with a whole periphery part of the transparent lid section 26. Thus, it is possible to provide a solid-state image sensing device, which realizes adequate camera function by blocking unnecessary light to the transparent lid section.

7 Claims, 9 Drawing Sheets

FOREIGN PATENT DOCUMENTS

| | | |
|---|---|---|
| JP | 04-050907 A | 2/1992 |
| JP | 10-90584 | 4/1998 |
| JP | 2003-295033 A | 10/2003 |
| JP | 2005-37865 A | 2/2005 |
| JP | 2006-049371 A | 2/2006 |
| JP | 2006-195452 A | 7/2006 |
| JP | 3124292 U | 7/2006 |
| JP | 2006-276463 A | 10/2006 |
| JP | 2007-052199 A | 3/2007 |
| JP | 2007-94364 A | 4/2007 |
| JP | 2007-108413 A | 4/2007 |

* cited by examiner

SOLID-STATE IMAGE SENSING DEVICE AND ELECTRONIC APPARATUS COMPRISING SAME

This Nonprovisional application claims priority under 35 U.S.C. §119(a) on Patent Application No. 120199/2007 filed in Japan on Apr. 27, 2007, the entire contents of which are hereby incorporated by reference.

FIELD OF THE INVENTION

The present invention relates to a solid-state image sensing device and an electronic apparatus.

BACKGROUND OF THE INVENTION

Conventional camera modules (solid-state image sensing devices) for capturing images used in portable phones and the like are arranged such that a circuit board, a lens, and a lens holder are incorporated into a package. The circuit board includes a solid-state image sensor (CCD (charge-coupled device) or CMOS (complementary metal-oxide semiconductor) sensor IC (integrated circuits)), an infrared filter, and a terminal. The lens holder holds the lens.

It is important for these camera modules to satisfy the following two conditions: (a) an optical center of the image sensing surface of the solid-state image sensor is concentric to an optical center of the lens; and (b) the plane surface of the image sensing surface and the optical axis of the lens are orthogonal to each other.

Poor alignment precision of the lens with respect to the solid-state image sensor disables the satisfaction of these conditions. This causes problems such as images are out of focus, or images are recognized dark by the solid-state image sensor.

In response to this, the position of the lens is adjusted at the final stage of manufacture right before the camera module is shipped, so as to satisfy the conditions. The distance from the center of the lens to the image sensing surface of the solid-state image sensor (focal length) is adjusted to the image forming length of the lens in this adjustment of lens position.

However, an optical adjustment step requires high-cost investment in plant and equipment, as well as manpower. In addition, optical adjustment requires considerable skill; plenty of work hours are also required.

Furthermore, the lens holder requires a specific arrangement for optical adjustment in order to perform optical adjustment. Therefore, it is difficult to downsize the conventional camera module structurally. In addition, mass production is difficult if the lens holder is constructed by mechanical components. Moreover, material costs and the like occupy a high proportion of production costs. Consequently, production costs increase.

Figure 11:
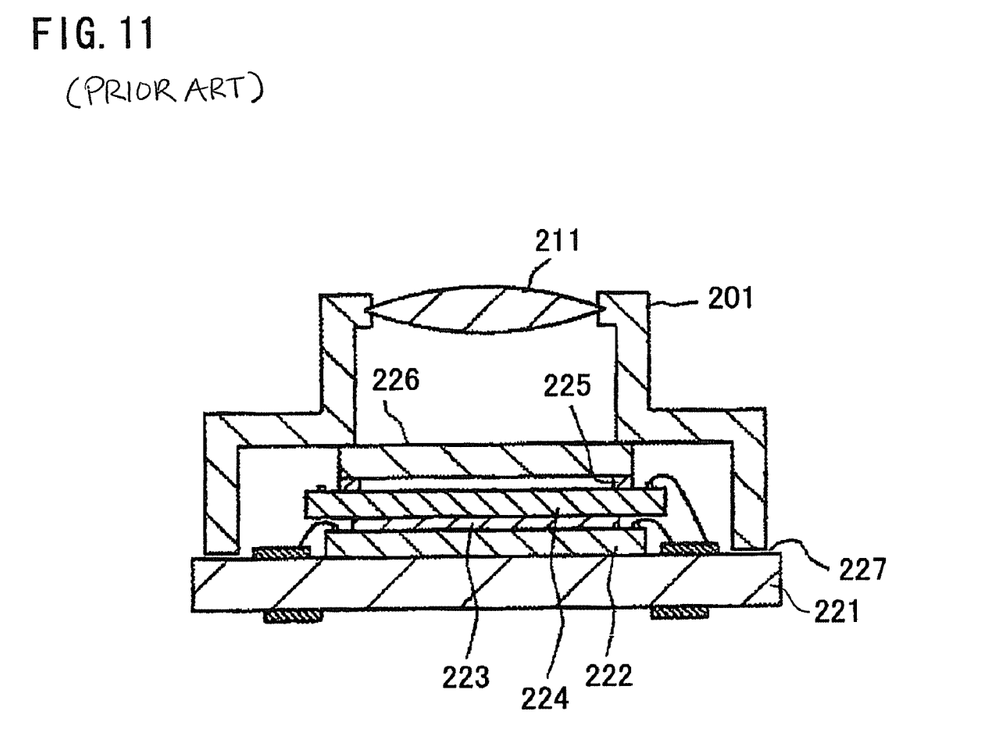
FIG. 11 is a cross sectional view illustrating a camera module described in Patent Document 1.

Patent Document 1 discloses a camera module which can easily perform optional adjustment, as illustrated in FIG. 11. In this camera module, a lens 211 is held by a lens holder 201. The lens holder 201 has contact with a glass plate 226. The glass plate 226 is arranged on the top surface of a solid-state image sensor 224 in high precision. This lens holder 201 is adhered to a circuit board 221 with an adhesive 227. This arrangement enables the optical distance (focal length) and the image forming length of the lens to be of the same length. The optical distance is the distance between the lens 211 and the solid-state image sensor 224. Thus, an optical adjusting step is not required in this arrangement.

However, this arrangement stacks an image processing device 222, the solid-state image sensor 224 and the glass plate 226 on the circuit board 221. Furthermore, the lens holder 201 is adhered to the glass plate 226. In other words, the lens holder 201 and the circuit board 221 are joined solely by the adhesive 227. Therefore, if the lens holder receives shock, problems may occur such as displacement of the lens holder 201 with respect to the circuit substrate 221, or breakage of the solid-state image sensor 224, the image processing device 222 or other components.

Patent Documents 2 and 3 disclose solid-state image sensing devices which solve this problem. The disclosed solid-state image sensing devices have a sealing section, which seals the solid-state image sensor and a transparent lid with resin. The transparent lid is sealed in such a manner that a part or whole of the transparent lid is exposed. A holder which holds the optical member is arranged to have contact with the exposed part of the transparent lid, thereby fixing an optical demarcation device to an image sensing section.

Patent Document 1

Japanese Unexamined Patent Publication, Tokukai, No. 2004-301938 (published on Oct. 28, 2004)

Patent Document 2

Japanese Unexamined Patent Publication, Tokukai, No. 2006-279533 (published on Oct. 12, 2006)

Patent Document 3

Japanese Unexamined Patent Publication, Tokukai, No. 2006-287533 (published on Oct. 19, 2006)

However, Patent Documents 2 and 3 do not disclose an arrangement in the transparent lid section to block unnecessary light from an outside. Therefore, unnecessary light from the outside finds a way inside the transparent lid section. As a result of this, malfunctions occur such as blurring of the whole photographed image, smear (bright-lines appearing vertically on the screen) appearing in the image, and glower (part of a screen hazily brightens) appearing in the image. Therefore, adequate camera functions cannot be realized.

SUMMARY OF THE INVENTION

The present invention is made in consideration of the problems, and an object thereof is to provide a solid-state image sensing device which realizes adequate camera functions by blocking unnecessary light to the transparent lid section, and an electronic apparatus incorporating such a solid-state image sensing device.

In order to attain the object, a solid-state image sensing device of the present invention includes an optical unit which includes a lens for guiding light from outside to a receiving surface of a solid-state image sensor and a lens holder for holding the lens therein; and an image sensing unit which includes a solid-state image sensor and a transparent lid section arranged so as to face the photosensitive surface of the solid-state image sensor with a space therebetween, the lens holder being engaged with a whole periphery part of the transparent lid section.

According to the invention, the lens holder is engaged with the transparent lid section. Thus, a whole outer edge of the transparent lid section is covered by the lens holder. This prevents the leaking-in of unnecessary light from the outside via an outer edge (side surface) of the transparent lid section. Therefore, blurring of the photographed image due to the unnecessary light from the outside will not be caused, thus enabling to realize an adequate camera function.

According to the invention, the optical unit and the image sensing unit are fixed detachable from each other, by engaging the lens holder with the transparent lid section. Thus, detachment and attachment of the optical unit and the image sensing unit as well as replacement of broken units are easily performed.

In addition, in order to attain the object, an electronic apparatus of the present invention includes the aforementioned solid-state image sensing device.

According to the invention, an electronic apparatus includes the solid-state image sensing device of the present invention. Thus, an electronic apparatus which can realize adequate camera functions is provided, by blocking unnecessary light from the outside.

Additional objects, features, and strengths of the present invention will be made clear by the description below. Further, the advantages of the present invention will be evident from the following explanation in reference to the drawings.

DESCRIPTION OF THE EMBODIMENTS

One embodiment of the present invention is described below with reference to drawings.

A solid-state image sensing device of the present invention is suitable for electronic devices capable of taking photographs, such as portable phones with a built-in camera, digital still cameras, and security cameras. The present embodiment describes a camera module (solid-state image sensing device) applied to a portable phone with a built-in camera.

Figure 1:
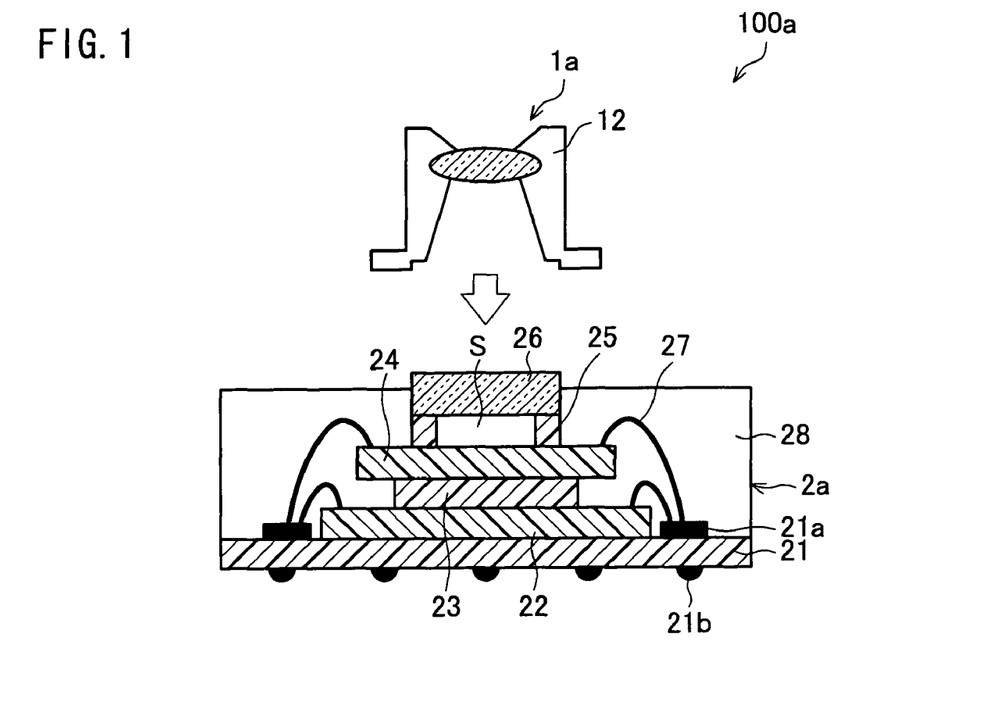
FIG. 1 is a cross sectional view of a camera module pertaining to one embodiment of the present invention.

FIG. 1 is a cross sectional view of a camera module 100a of the present embodiment. The camera module 100a is manufactured by combining a lens unit (optical unit) 1a and an image sensing unit 2a. The lens unit 1a is mounted on the image sensing unit 2a. For the sake of easy explanation, the side where the lens unit 1a is located is denoted as an upper side, and the side where the image sensing unit 2a is located is denoted as a lower side in the following description.

<Lens Unit 1a>

Figure 2:
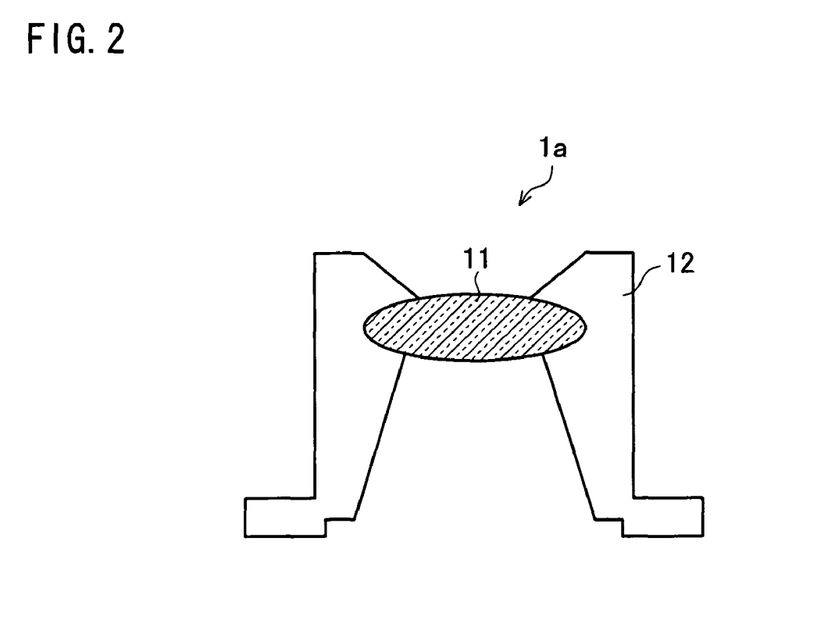
FIG. 2 is a cross sectional view of a lens unit in the camera module shown in FIG. 1.
Figure 3A:
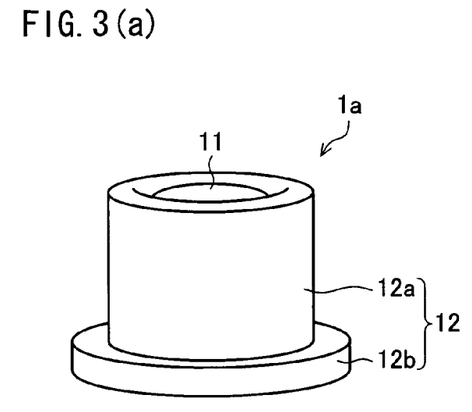
FIG. 3(a) is a perspective view of an external view of a lens unit of the camera module shown in FIG. 1.
Figure 3B:
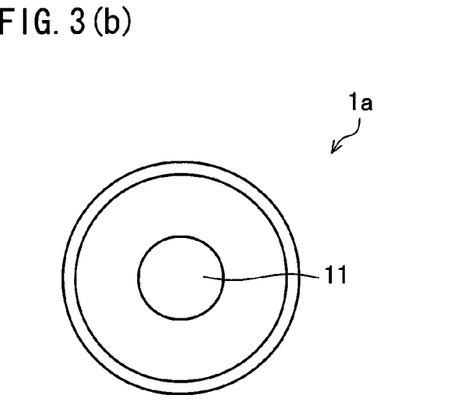
FIG. 3(b) is a top view of a lens unit of the camera module shown in FIG. 1.
Figure 4A:
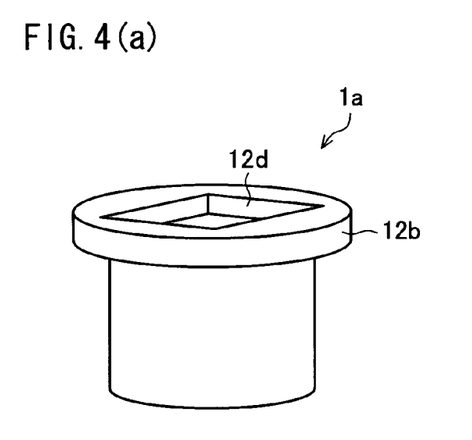
FIG. 4(a) is a perspective view of an external view of a lens unit in the camera module shown in FIG. 1.
Figure 4B:
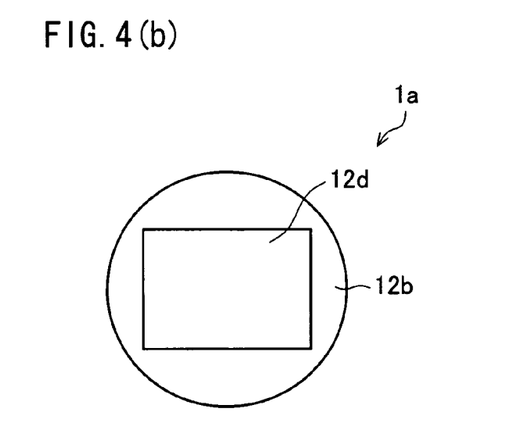
FIG. 4(b) is a bottom view of a lens unit in the camera module shown in FIG. 1.

The following description deals with the lens unit 1a. FIG. 2 is a cross sectional view of the lens unit 1a. FIG. 3(a) is a perspective view of an external view of the lens unit 1a. FIG. 3(b) is a top view of the lens unit 1a. FIG. 4(a) is a perspective view illustrating an external view of the lens unit 1a shown in FIG. 3(a), transposing the top and bottom (front and back) thereof. FIG. 4(b) is a bottom view of the lens unit 1a.

The lens unit 1a is a photographic optical system (optical structure) which forms a subject image. Namely, the lens unit 1a is an optical path demarcation device for guiding light from an outside to a receiving surface (image sensing surface) of the image sensing unit 2a.

The lens unit 1a is constructed of a lens 11 and a lens holder 12, as illustrated in FIG. 2.

The lens holder 12 is a frame body for holding (supporting) the lens 11 therein. The lens 11 is arranged in the upper center of the lens holder 12. The lens holder 12 functions so as to arrange the lens unit 1a on the image unit 2a in an appropriate position. The lens holder 12 is a hollow (tubular) member, and the lens 11 is held therein. Therefore, an optical path is secured from the lens 11 to a receiving surface of a solid-state image sensor 24.

The lens holder 12 includes a lens barrel section 12a and an alignment section 12b. The lens 11 is arranged in the upper center of the lens barrel section 12a. The alignment section 12b arranges the lens unit 1a on the image sensing unit 2a in an appropriate position.

In other words, the lens barrel section 12a is a fuselage section of the lens unit 1a, whereas the alignment section 12b is a flange of the lens unit 1a.

The alignment section 12b has a larger diameter than the lens barrel section 12a. An opening 12d is provided on the alignment section 12b, as illustrated in FIGS. 4(a) and 4(b). The opening 12d is of a shape which engages with the shape of the area where the lens unit 1a is to be arranged on the image sensing unit 2a. Therefore, the lens unit 1a is unmistakably mounted on the image sensing unit 2a in the appropriate position because of the opening 12d, as later described. The opening 12d performs alignment function of the lens unit 1a and the image sensing unit 2a.

The lens holder 12 engages with a whole periphery of a transparent lid section 26 in the image sensing unit 2a, as later described.

<Image Sensing Unit 2a>

The following description deals with the image sensing unit 2a.

The image sensing unit 2a is an image sensing section which converts a subject image formed by the lens unit 1a to electric signals. In other words, the image sensing unit 2a is a sensor device which photoelectrically converts incident light from the lens unit 1a.

The image sensing unit 2a includes a circuit board 21, a DSP (digital signal processor) 22, a spacer 23, the solid-state image sensor 24, an adhesive section 25, and the transparent lid section 26. The DSP 22, the spacer 23, the solid-state image sensor 24, the adhesive section 25 and the transparent lid section 26 are stacked on the circuit board 21. Terminals 21a are formed on the surface of the circuit board 21 (surface on which the DSP 22 and the other components are mounted). The terminals 21a are electrically connected to the DSP 22 and the solid-state image sensor 24 via wires 27, respectively. The image sensing unit 2a in the camera module 100a of the present embodiment is arranged so that each member assembled on the circuit board 21 is sealed with a sealing section 28 (resin sealing). The sealing section 28 is formed from mold resin. The sealing section 28 seals the members in such a manner that a surface of the transparent lid section 26 is exposed.

The following description deals with each of the members included in the image sensing unit 2a in detail.

The circuit board 21 is a board which has a patterned wiring (not illustrated). The circuit board 21 is, for example, a print board, a ceramic board, or the like. The terminals 21a for wire bonding and electrodes 21b for external connection are formed on the top surface and the bottom surface of the circuit board 21, respectively. The terminals 21a and the electrodes 21b are electrically connected with each other.

The terminals 21a are electrically connected with the DSP 22 and the solid-state image sensor 24 via the wires 27, respectively. The DSP 22 and the solid-state image sensor 24 are stacked on a central part of the circuit board 21. The electrical connection of these components enable sending and receiving of electric signals. The electrodes 21b enable input and output of signals between the camera module 100a and the electronic apparatus such as a digital camera or a portable phone with a built-in camera, which are equipped with the camera module 100a.

The DSP 22 is a semiconductor chip which controls the performance of the solid-state image sensor 24, and processes the signal outputted from the solid-state image sensor 24. The circuit board 21 has other electronic components thereon, such as a CPU, a ROM, and a RAM, though these are not illustrated. The CPU performs various operation processes in accordance with a program. The ROM stores the program, and the RAM stores data and the like for each of the processes. These electronic components control the camera module 100a as a whole.

On the surface of the DSP 22, a plurality of bonding pads (not illustrated) are formed for input and output of electric signals.

The spacer 23 is arranged between the DSP 22 and the solid-state image sensor 24. The spacer 23 adjusts the distance between the DSP 22 and the solid-state image sensor 24. Specifically, the height of the spacer 23 is adjusted so as to avoid contact of the wire 27 to be connected to the DSP 22 and the wire 27 to be connected to the solid-state image sensor 24. For the spacer 23, for example, a silicon piece will be applied.

The solid-state image sensor 24 converts the subject image formed by the lens unit 1a to electric signals. In other words, the solid-state image sensor 24 is a sensor device which photoelectrically converts incident light from the lens unit 1a. The solid-state image sensor 24 is, for example, a CCD or a CMOS sensor IC. A receiving surface is formed on the surface (top surface) of the solid-state image sensor 24. The receiving surface has a plurality of pixels arranged in matrix form. The receiving surface is an area which forms an image using the incident light from the lens unit 1a (image forming area), and may be referred as a pixel area. The image sensing surface of the image sensing unit 2a is this receiving surface (pixel area).

The solid-state image sensor 24 converts the subject image formed on the receiving surface (pixel area) to electric signals. The electric signals are then outputted as analog image signals. That is to say, photoelectric conversion is performed on the receiving surface. The operation of the solid-state image sensor 24 is controlled at the DSP 22. The image signals created at the solid-state image sensor 24 is processed at the DSP 22.

An adhesive section 25 is provided on the surroundings of the receiving surface of the solid-state image sensor 24. The adhesive section 25 adheres the transparent lid section 26 on the solid-state image sensor 24. The receiving surface of the solid-state image sensor 24 is thus covered by the transparent lid section 26.

The adhesive section 25 is provided so as to peripherally surround the receiving surface of the solid-state image sensor 24. The adhesive section 25 adheres the transparent lid section 26 to the solid-state image sensor 24, so as to face the receiving surface of the solid-state image sensor 24. The adhesive section 25 adheres the receiving surface of the solid-state image sensor 24 and the transparent lid section 26 so that a space (gap) S is formed therebetween. Sealing the space S prevents the penetration of moisture to the receiving surface, and the penetration and adhering of dust on the receiving surface. Thus, occurrence of malfunction on the receiving surface is prevented.

The transparent lid section 26 is formed from transparent members such as glass. In the camera module 100a, the transparent lid section 26 is engaged with the lens holder 12, and the size of the transparent lid section 26 is smaller than that of the solid-state image sensor 24. Consequently, downsizing of the transparent lid section 26 enables the downsizing of the lens holder 12 (and thus the lens unit 1a). That is to say, it is possible to realize a camera module 100a downsized to a chip-size.

In the present embodiment, an infrared ray insulating film is formed on the surface of the transparent lid section 26 (surface exposed from the sealing section 28). Therefore, the transparent lid section 26 also has a function to block infrared rays.

The adhesive section 25 is formed by, for example, a patterning which processes exposure and development by photolithography technique, following the attachment of a sheet-shaped adhesive on the solid-state image sensor 24. The use of photolithography technique allows high precision patterning of the adhesive section 25. In addition, the use of sheet-shaped adhesives allows even thickness of the adhesive section 25. Thus, the transparent lid section 26 is adhered in high precision, to the receiving surface of the solid-state image sensor 24.

Figure 5:
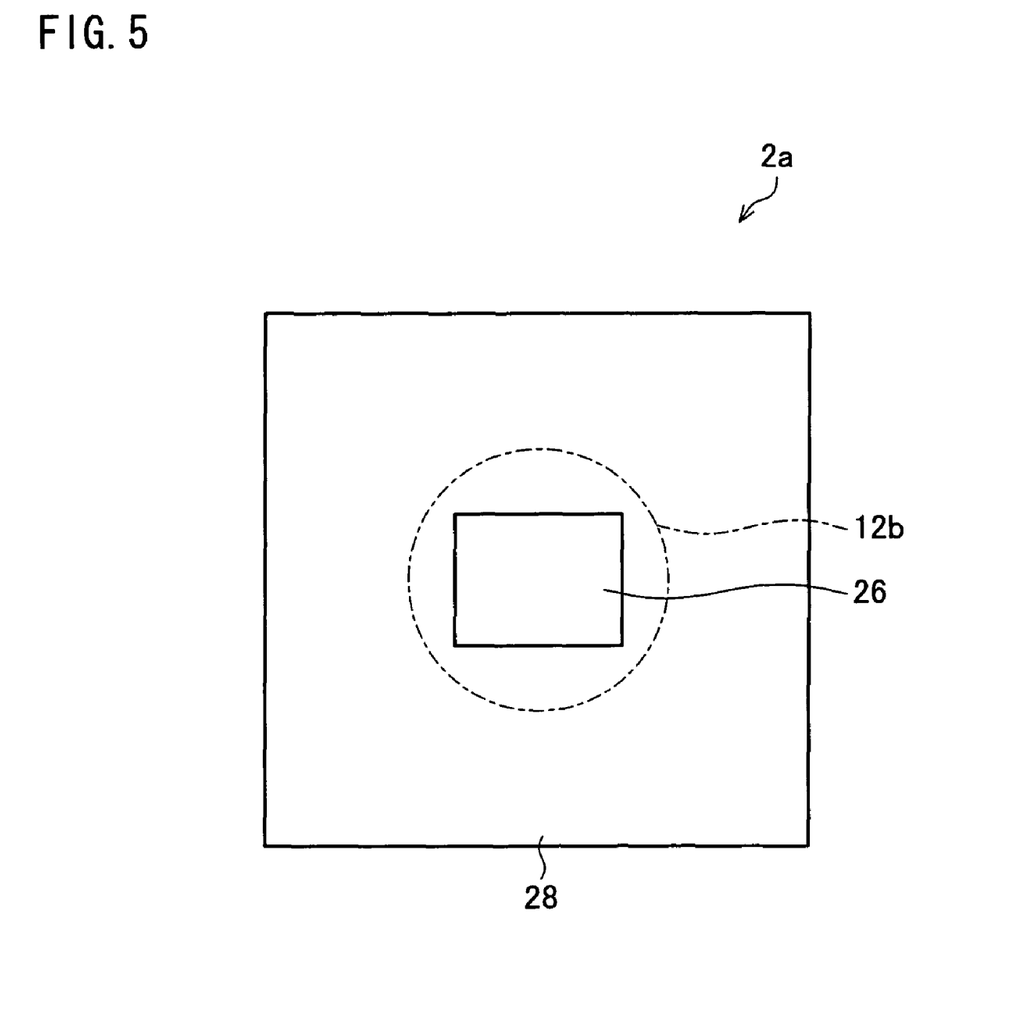
FIG. 5 is a top view of a lens unit of the camera module shown in FIG. 1.

The sealing section 28 seals each member stacked on the circuit board 21 with mold resin (sealing resin), thereby fixedly holding each member. The sealing section 28 seals each member stacked on the circuit board 21 in such a manner that the light transmitting area of the camera module 100a is avoided. Therefore, the surface (top surface) of the transparent lid section 26 of the image sensing unit 2a is not sealed with the sealing section 28, and is exposed as illustrated in FIG. 5. Thus, light transmits to the receiving surface of the solid-state image sensor 24 through the transparent lid section 26. The height of the surface of the sealing section 28 is lower than that of the surface of the transparent lid section 26. Therefore, parts of the side surfaces of the transparent lid section 26 are also exposed from the sealing section 28.

The area indicated by the one-dot chain line in FIG. 5 is the area where the lens holder 12 (particularly the alignment section 12b) should be mounted on the image sensing unit 2a (mounting area). In the present embodiment, the transparent lid section 26 exposed from the sealing section 28 is engaged with the opening 12d provided on the bottom surface of the lens holder 12 (alignment section 12b). Therefore, the lens holder 12 is unmistakably assembled on the area indicated by the one-dot chain line in FIG. 5. In other words, the lens unit 1a and the image sensing unit 2a are aligned in high precision. As such, the lens unit 1a is unmistakably mounted on a specific position on the image sensing unit 2a. In addition, the lens unit 1a can be arranged so that the optical axis of the lens 11 is concentric to the optical center of the solid-state image sensor 24.

The present embodiment contains the DSP 22 and the solid-state image sensor 24 in the same module, and the sealing section 28 seals each member stacked on the circuit board 21. That is to say, the camera module 100a is of a CSP (Chip Scale Package) structure. Thus, it is possible to downsize electronic apparatuses such as digital cameras and portable phones with a built-in camera, each of which installs the camera module 100a. In addition, the sealing section 28 seals the camera module 100a including all of the DSP 22, the solid-state image sensor 24, and the wires 27 which connect the terminals 21a with the DSP 22 and the solid-state image sensor 24. Therefore, the arrangement of the camera module 100a is suitable for microminiaturization and extreme reduction of thickness.

The camera module 100a performs capturing an image as follows. Firstly, light from the outside is guided to the receiving surface (image sensing surface) of the image sensing unit 2a, and a subject image is formed thereon. The subject image is converted to electric signals at the image sensing unit 2a. The image sensing unit 2a performs various processes (such as image processing) to the electric signals.

A principal feature of the camera module 100a of the present embodiment is that the structure blocks unnecessary light to the transparent lid section 26.

More specifically, the camera module 100a is arranged so that the lens holder 12 (opening 12d) is engaged with the whole periphery of the transparent lid section 26. Thus, the lens holder 12 covers the whole outer edge of the transparent lid section 26. That is to say, the lens holder 12 covers the surrounding of the transparent lid section 26. This prevents the unnecessary light from the outside leaking in from the outer edge of the transparent lid section 26 (side surfaces). Therefore, blurring of the photographed image due to the unnecessary light from the outside will not be caused, thus enabling to realize an adequate camera function.

Furthermore, the lens unit 1a and the image sensing unit 2a are fixed detachable from each other, by engaging the lens holder 12 with the transparent lid section 26. Thus, the attachment and detachment of the optical unit and the image sensing unit as well as the replacement of broken units are easily performed.

As in the present embodiment, in case of the camera module 100a including a sealing section 28, the engaging of the lens holder 12 and the transparent lid section 26 is preferable such that the lens holder 12 and the transparent lid section 26 are engaged with each other in a state in which the lens holder 12 and the sealing section 28 are in contact with each other. For example, it is preferable that the bottom surface of the lens holder 12 and the surface of the sealing section 28 are in contact (plane contact) with each other. Thus, a gap is not formed between the sealing section 28 and the lens holder 12, thereby not leaking in light from the outside via this gap. Therefore, leaking-in of light from the outside via the outer edge of the transparent lid section 26 is securely prevented. That is to say, the light blocking effect is enhanced.

Figure 6A:
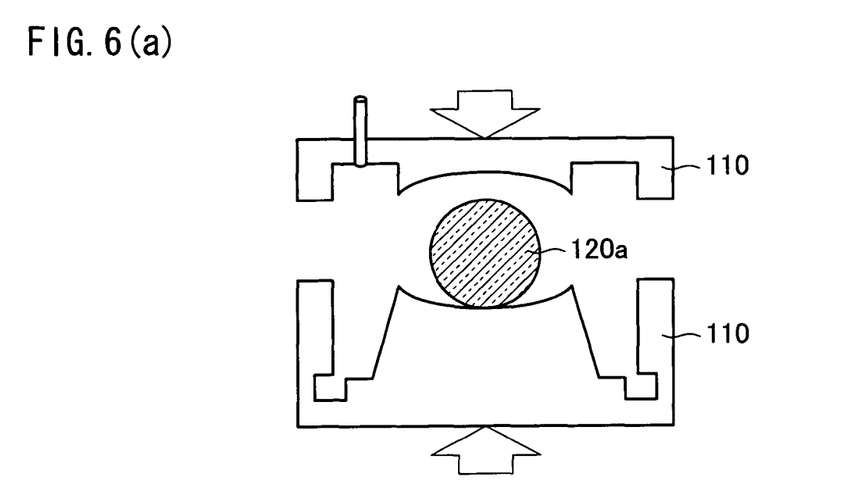
FIG. 6(a) is a cross sectional view illustrating a manufacturing example of a lens unit in FIG. 2.
Figure 6B:
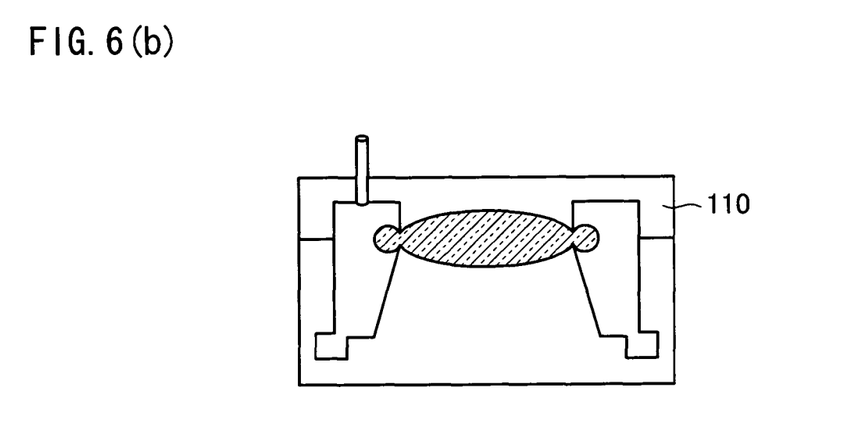
FIG. 6(b) is a cross sectional view illustrating a manufacturing example of a lens unit in FIG. 2.
Figure 6C:
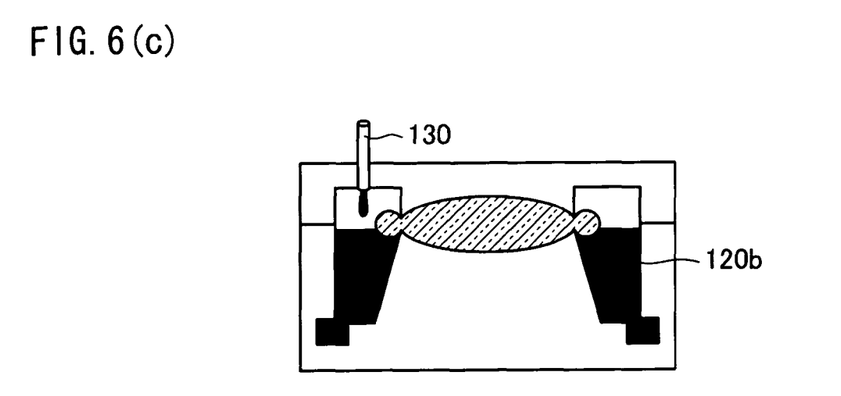
FIG. 6(c) is a cross sectional view illustrating a manufacturing example of a lens unit in FIG. 2.

It is preferable for the camera module 100a to have the lens 11 and the lens holder 12 both be made of resin. More specifically, the lens 11 is made of transparent resin, and the lens holder 12 is made of colored resin (resin with color). By thus constructing the lens 11 and the lens holder 12 with resin, the lens unit 1a can be molded integrally. FIGS. 6(a) through 6(c) are cross sectional views illustrating a manufacturing example of the lens unit 1a. As shown in FIG. 6(a), resin 120a for molding the lens is supplied in part of the mould 110, where a lens is to be formed. The mould 110 is then closed. This forms the shape of the lens 11 as shown in FIG. 6(b). The overflowing resin 120a for the lens flows into the mould for the lens holder 12. In the state the mould 110 is closed, resin 120b for the lens holder is injected from a resin injecting section 130 provided on the mould 110, as shown in FIG. 6(c). The injected resin is then cured, thereby forming an integrated lens unit 1a. As such, an integrally-molded lens unit 1a improves the shock-resistance and the environmental-resistance of the camera module 100a. Use of colored resin as the lens holder resin 120b enhances the light blocking effect of the lens holder 12.

In the case the lens unit 1a is molded, the image sensing unit 2a may also be manufactured by using a mould. The lens unit 1a and the image sensing unit 2a may be manufactured by using a single mould. The lens unit 1a and the image sensing unit 2a may be molded by using a single resin (for example, a transparent resin), and a light-blocking process such as adding color or plating metal may be performed to just the lens holder 12.

The following description deals with another arrangement example of the camera module 100a.

Another Arrangement Example 1

Figure 7A:
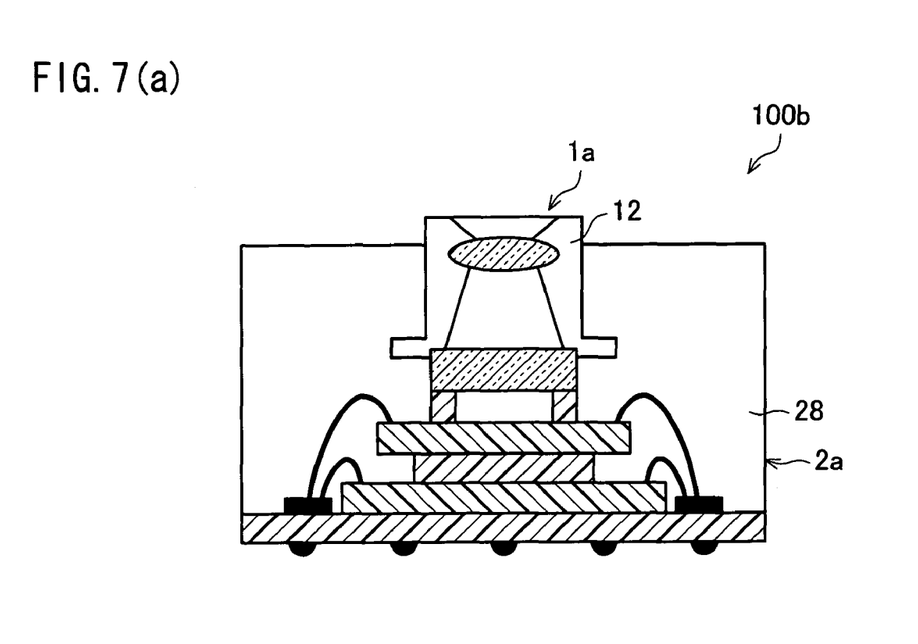
FIG. 7(a) is a cross sectional view of a camera module in which a lens unit and an image sensing unit are collectively sealed.
Figure 7B:
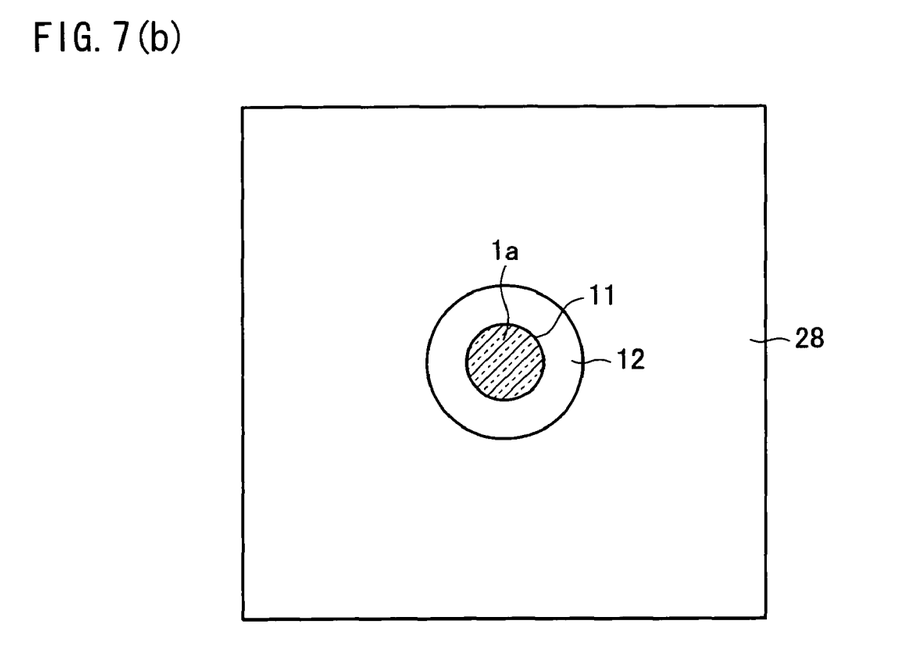
FIG. 7(b) is a top view of a camera module in which a lens unit and an image sensing unit are collectively sealed.

FIGS. 7(a) and 7(b) are cross sectional views of a camera module 100b. In these drawings, a lens unit 1a and an image sensing unit 2a are arranged integrally in the camera module 100b. A sealing section 28 collectively seals the lens unit 1a and the image sensing unit 2a with resin. In other words, in the camera module 100b, the sealing section 28 seals the lens unit 1a as well as the image sensing unit 2a. Except that the lens unit 1a and the image sensing unit 2a are collectively sealed by the sealing section 28, the camera module 100b has the same arrangement as the camera module 100a shown in FIG. 1.

In an arrangement as like the camera module 100b where the sealing section 28 collectively seals the lens unit 1a and the image sensing unit 2a, the lens unit 1a and the image sensing unit 2a do not separate even if shock or the like is received. Therefore, it is advantageous that shock-resistance and environmental-resistance are improved.

"Shock-resistance" indicates the decrease in failure rate, caused by dropping the camera module 100b, or the camera module 100b receiving shock or vibration. Particularly, breakage of packaging is less likely to occur in the camera module 100b.

"Environmental-resistance" indicates that penetration of moisture (water), dust, chemical substances, aggressive gas and the like are prevented when storing, using or doing any other operation with the camera module 100*b*.

The conventional camera module which has the lens adhered to the lens holder by an adhesive may peel off due to shock, if the amount of the adhesive applied is small. The adhesive may also lose its adhesion force caused by age deterioration (e.g. oxidation, hydrolysis) of the adhesive. This is caused by the adhesive component melting into the solvent of the adhesive. Therefore, the conventional camera module has problems in both shock-resistance and environmental-resistance.

Another Arrangement Example 2

Figure 8A:
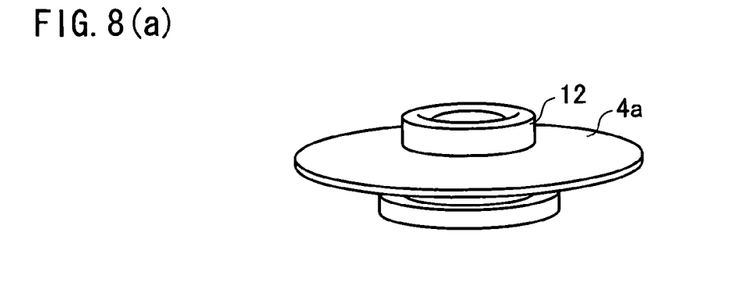
FIG. 8(a) is a perspective view illustrating a pressing member fixed to a lens holder.
Figure 8B:
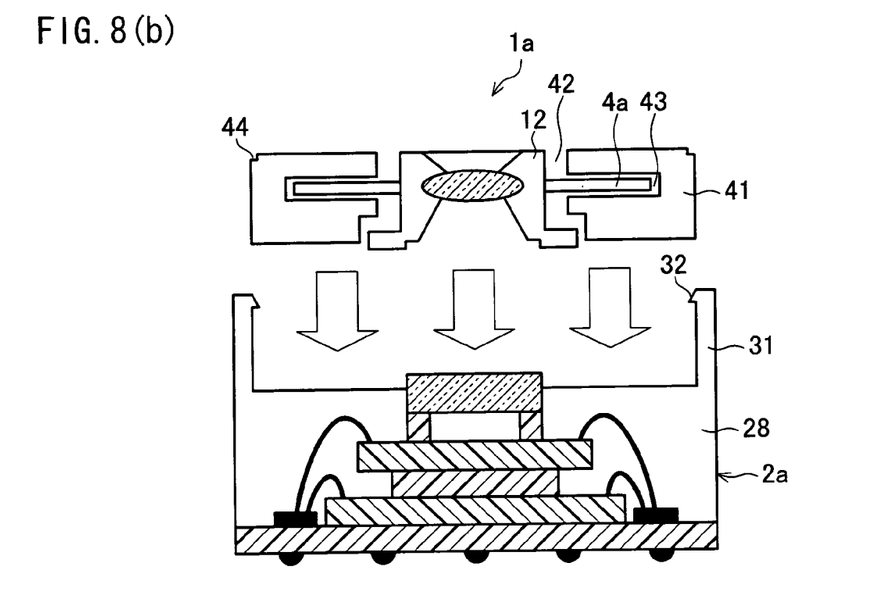
FIG. 8(b) is a cross sectional view illustrating a camera module which fixes a lens unit and an image sensing unit by the pressing member shown in FIG. 8(a).
Figure 8C:
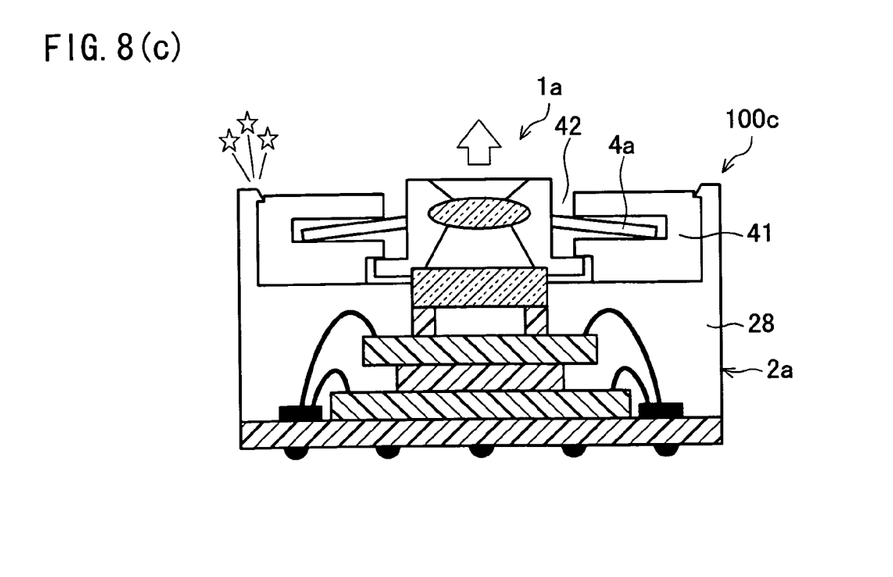
FIG. 8(c) is a cross sectional view illustrating a camera module which fixes a lens unit and an image sensing unit by the pressing member shown in FIG. 8(a).

The following description deals with an arrangement where a pressing member 4*a* as like the one illustrated in FIG. 8(*a*) firmly fixes the lens unit 1*a* and the image sensing unit 2*a*. FIG. 8(*a*) is a perspective view illustrating the pressing member 4*a* fixed on the lens holder 12. FIGS. 8(*b*) and 8(*c*) are cross sectional views illustrating the state where the lens unit 1*a* and the image sensing unit 2*a* are fixed by the pressing member 4*a*.

To a substantially mid of periphery side of the lens holder 12, a disc-shaped pressing member 4*a* is fixed, as shown in FIG. 8(*a*). The lens unit 1*a*, as illustrated in FIGS. 8(*b*) and 8(*c*), includes a supporting section 41 which supports the lens 12 via the pressing member 4*a*. The shape of the supporting section 41 is a substantially parallelepiped rectangular shape, and the size of the top surface and the bottom surface is made substantially equal to the top surface and bottom surface of the image sensing unit 2*a*. A through-hole 42 which vertically penetrates the supporting section 41 is provided in the supporting section 41. The diameter of the through-hole 42 is larger than the diameter of the lens holder 12. A groove 43 is provided on the substantially mid of the through-hole 42. The groove 43 has a larger diameter than the diameter of the lens holder 12. The pressing member 4*a* fixed to the lens holder 12 is inserted into this groove 43. Thus, the lens holder 12 is supported by the pressing member 4*a* inserted into the through-hole 42 of the supporting section 41. The groove 43 is formed slightly larger than the pressing member 4*a*. Therefore, the lens holder 12 and the pressing member 4*a* are movable inside the through-hole 42, in the axis direction of the through-hole 42 and the horizontal direction orthogonal to the axis.

A claw engaging section 44 is provided on the substantially mid of the outer edge part of the supporting section 41 (substantially mid of the sides on the surface of the supporting section 41 which face each other). The claw engaging section 44 is a rectangular groove provided on the outer edge part of the supporting section 41 in a vertical direction. The sealing section 28 of the image sensing unit 2*a* is arranged such that an arm section 31 and a claw section 32 rise upwardly. The claw engaging section 44 engages with this arm section 31 and claw section 32. Thus, the lens unit 1*a* and the image sensing unit 2*a* are fixed. The top end part of the claw engaging section 44 has the groove formed slightly deep, in order to engage the claw 32. The claw 32 is provided on the tip of the sealing section 28 of the image sensing unit 2*a*.

Thus, as illustrated in FIG. 8(*c*), the lens unit 1*a* and the image sensing unit 2*a* are engaged together by the claw engaging section 44 of the lens unit 1*a* and the arm section 31 and the claw section 32 of the sealing section 28 of the image sensing unit 2*a*. More specifically, the components are fixed such that the top surface of the sealing section 28 of the image sensing unit 2*a* has contact with the bottom surface of the supporting section 41 of the lens unit 1*a*. Meanwhile, the whole outer edge of the transparent lid section 26 exposed from the sealing section 28 is covered by the lens holder 12, due to the engaging of the transparent lid section 26 with the opening 12*d* of the lens holder 12. That is to say, the surrounding of the transparent lid section 26 is covered by the lens holder 12. The relative position of the lens holder 12 and the transparent lid section 26 are fixed by thus having the bottom surface of the lens holder 12 and the surface of the sealing section 28 in contact (plane contact) with each other. Meanwhile, the top end part of the lens holder 12 protrudes from the through-hole 42. On the other hand, the pressing member 4*a* is fixed in a position higher than the groove 43 provided on the supporting section 41. The lens holder 12 is thus pushed in a downward direction by the pressing member 4*a*, whereby the lens holder 12 is firmly fixed to the transparent lid section 26.

As such, in the camera module 100*c* in FIG. 8(*c*), the lens unit 1*a* includes the pressing member 4*a* fixed to the lens holder 12 and the supporting section 41 which supports the pressing member 4*a*. The pressing member 4*a* presses the lens holder 12 to the transparent lid section 26 when the lens unit 1*a* and the image sensing unit 2*a* are fixed together, and the lens holder 12 is to engage with the transparent lid section 26. Thus, it is possible to firmly fix the lens unit 1*a* and the image sensing unit 2*a*. Furthermore, the pressing unit 4*a* absorbs shock from the outside, thereby protecting the camera module 100*c* from shock.

Figure 9A:
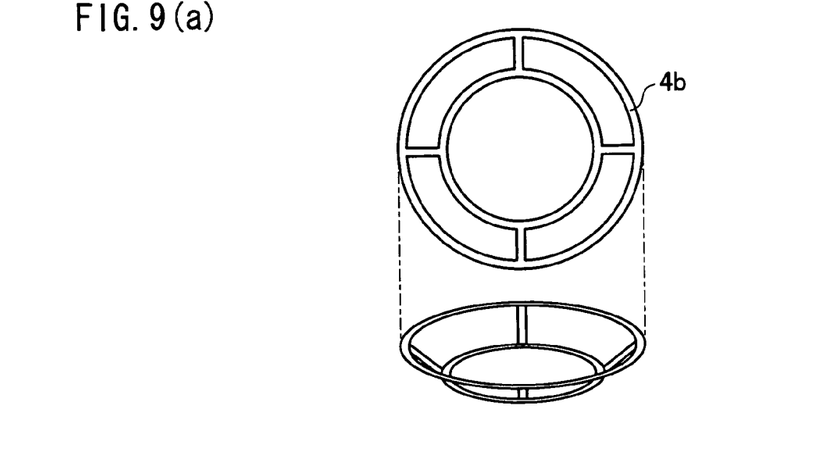
FIG. 9(a) is a top view and a perspective view illustrating another pressing member.
Figure 9B:
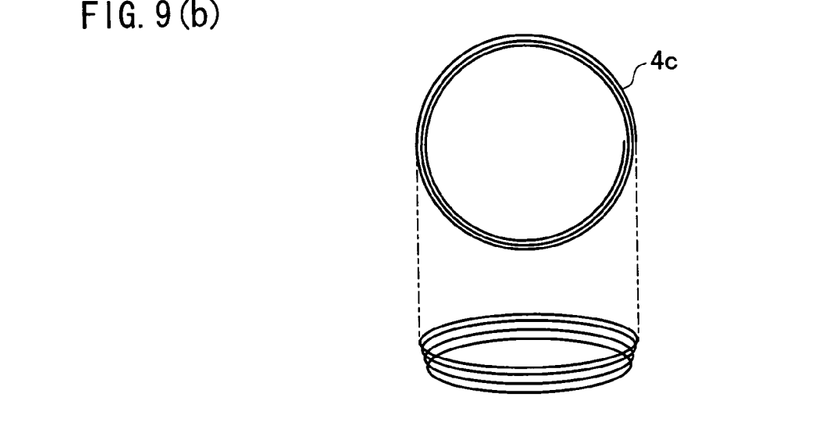
FIG. 9(b) is a top view and a perspective view illustrating another pressing member.
Figure 9C:
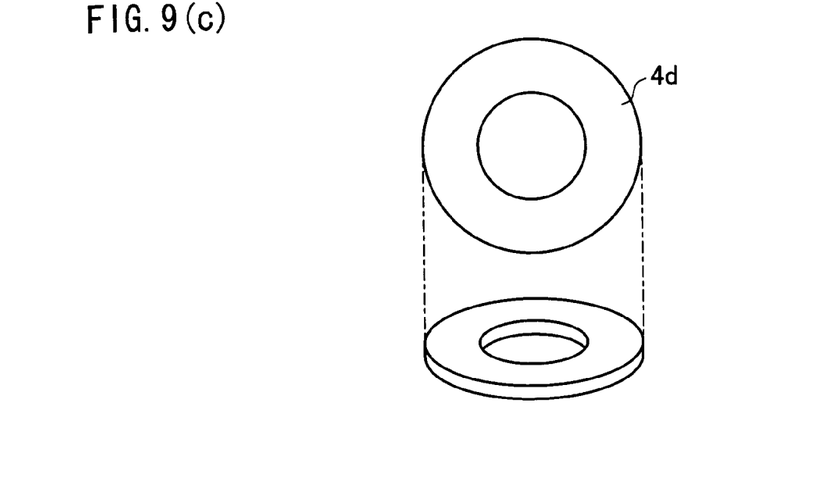
FIG. 9(c) is a top view and a perspective view illustrating another pressing member.

The pressing member 4*a* in FIG. 8(*a*) may be constructed by a plate spring, a washer, and other components which have no opening, as well as a gland packing and the like as illustrated in FIG. 9(*c*). In case a pressing member 4*a* which has no opening is used, not only does the lens holder 12 engage with the transparent lid section 26, but also leaking-in of unnecessary light to the solid-state image sensor 24 from the outside is securely prevented by the pressing member 4*a*.

The whole outer edge of the transparent lid section 26 exposed from the sealing section 28 is fully covered by the lens holder 12, provided that the lens holder 12 is engaged with the transparent lid section 26. With such arrangement, unnecessary light from the outside cannot leak into the solid-state image sensor 24. Therefore, a pressing member 4*b* which has an opening as shown in FIG. 9(*a*), or a spiral-shaped pressing member 4*c* as shown in FIG. 9(*b*) may be used. As such, there are no restrictions in the arrangement and material of the pressing member.

Figure 10A:
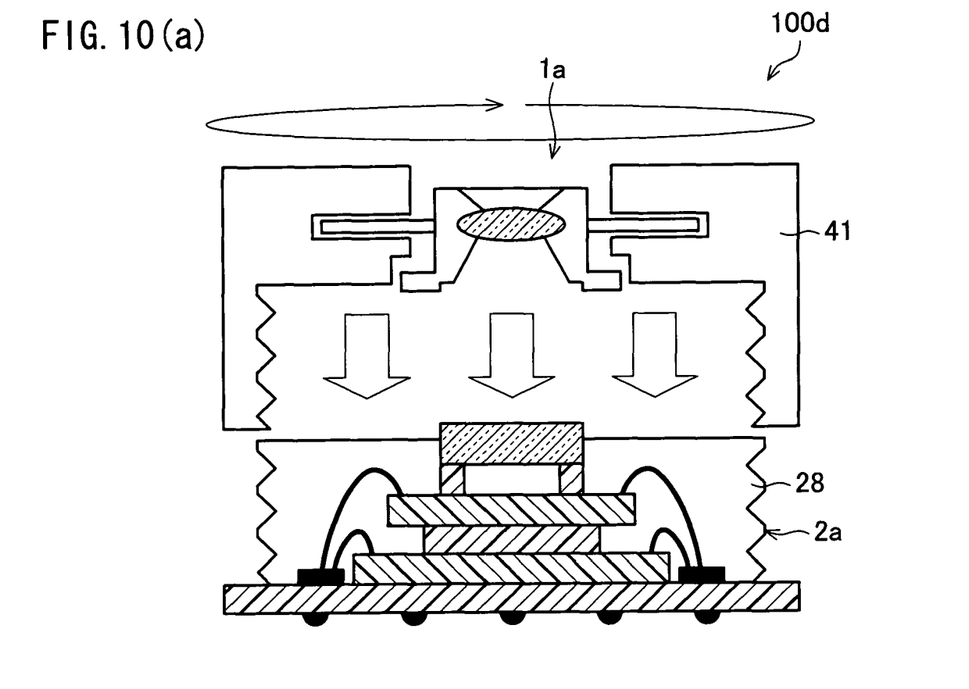
FIG. 10(a) is a cross sectional view illustrating yet another camera module which fixes a lens unit and an image sensing unit by using a pressing member.
Figure 10B:
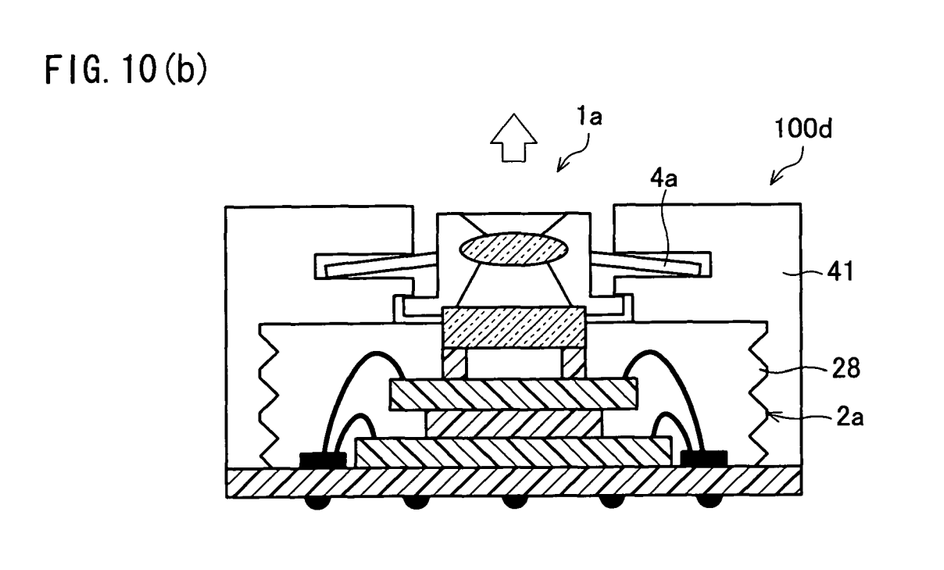
FIG. 10(b) is a cross sectional view illustrating yet another camera module which fixes a lens unit and an image sensing unit by using a pressing member.

FIGS. 10(*a*) and 10(*b*) are cross sectional views of a camera module 10*d*. The camera module 100*d* has the same arrangement as FIGS. 8(*b*) and 8(*c*), however the lens unit 1*a* and the image sensing unit 2*a* are fixed by a screw fixing method, fixing the supporting section 41 and the sealing section 28 by a screw. The same effects as the arrangements of FIGS. 8(*b*) and 8(*c*) are attained in these arrangements.

As described above, a solid-state image sensing device of the present invention is arranged such that the lens holder engages with the whole periphery part of the transparent lid section. Thus, it is possible to prevent the leaking-in of unnecessary light from the outside via the outer edge (side surface) of the transparent lid section. Therefore, blurring of the photographed image due to the unnecessary light from the outside will not be caused, thus enabling to realize an adequate camera function.

The solid-state image sensing device of the present invention is preferably arranged such that the image sensing unit includes a sealing section which seals the image sensing unit with resin in such a manner that a engaging section of the transparent lid section and the lens holder is not sealed; and the lens holder and the transparent lid section are engaged with each other in a state where the lens holder and the sealing section are in contact with each other.

According to the invention, the image sensing unit includes a sealing section. This makes the image sensing unit a CSP structure, thus enabling to reduce thickness of the image sensing unit.

In addition, according to the invention, the lens holder and the sealing section are in contact, and the lens holder is engaged with the transparent lid section. No space is provided between the sealing section and the lens holder, therefore no light from the outside leaks into the transparent lid section from such space. Consequently, leaking-in of unnecessary light from the outside to the transparent lid section via the outer edge thereof is securely prevented.

The solid-state image sensing device of the present invention may be arranged such that the sealing section seals the lens unit in addition to the image sensing unit.

According to the invention, the optical unit and the image sensing unit are integrally sealed with resin by the sealing section. Thus, the optical unit and the image sensing unit are integrated by the sealing section. This allows improvement in shock-resistance and environmental-resistance of the solid-state image sensing device.

The solid-state image sensing device of the present invention is preferably arranged such that the lens and the lens holder are made of resin.

According to the invention, the lens and the lens holder are both made of resin; thereby the lens unit is integrally molded. For example, the lens unit can be manufactured by using a mould processed in the shape of the lens unit. By thus manufacturing the lens unit by integral molding, the shock-resistance and the environmental-resistance of the solid-state image sensing device is improved.

The solid-state image sensing device of the present invention is preferably arranged such that the optical unit includes a pressing member fixed to the lens holder, and a supporting section supporting the pressing member, when the optical unit is fixed to the image sensing unit, the pressing member presses the lens holder to the transparent lid section, by which the lens holder is engaged with the transparent lid section.

According to the invention, the optical unit includes a pressing member fixed to the lens holder and a supporting section supporting the pressing member. In addition, the pressing member presses the lens holder to the transparent lid section when the optical unit is fixed to the image sensing unit, so as to engage the lens holder with the transparent lid section. Thus, the optical unit is firmly fixed to the image sensing unit. Furthermore, the pressing member absorbs shock from outside, thereby protecting the solid-state image sensing device from shock.

The solid-state image sensing device of the present invention may be arranged such that the pressing member has an opening.

According to the invention, the optical unit includes a pressing member which has an opening. The solid-state image sensing device of the present invention blocks unnecessary light from the outside leaking into the transparent lid section, by engaging the lens holder with the transparent lid section. Therefore, even if a pressing member which has an opening is applied to the device, no unnecessary light leaks in from the outside to the transparent lid section. Therefore, limitations in the shape and material of the pressing member are relaxed.

The solid-state image sensing device of Patent Documents 2 and 3 do not have any arrangements which block the unnecessary light leaking into the transparent lid section. Therefore, a pressing member which has an opening cannot be applied in Patent Documents 2 and 3.

An electronic apparatus of the present invention includes the solid-state image sensing device of any one of the foregoing.

According to the invention, an electronic apparatus includes the solid-state image sensing device of the present invention. Thus, an electronic apparatus which can realize adequate camera functions is provided, by blocking unnecessary light from the outside.

The present invention may be applied for solid-state image sensing devices which are used to perform image sensing in various image sensing devices (electronic apparatuses) such as portable phones with a built-in camera, digital still cameras, security cameras, and cameras for the purpose of installing to portable phones, vehicles, and interphones.

The present invention is not limited to the description of the embodiments above, but may be altered by a skilled person in the art within the scope of the claims. An embodiment based on a proper combination of technical means disclosed in different embodiments is encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A solid-state image sensing device comprising:
    an optical unit which includes a lens for guiding light from outside to a receiving surface of a solid-state image sensor and a lens holder for holding the lens therein; and
    an image sensing unit which includes the solid-state image sensor and a transparent lid section arranged so as to face the receiving surface of the solid-state image sensor with a space therebetween,
    the lens holder being engaged with a whole periphery part of the transparent lid section,
    the image sensing unit including a sealing section which seals the image sensing unit with resin but does not seal the optical unit with resin in such a manner that an engaging section of the transparent lid section and the lens holder is not sealed,
    the lens holder and the transparent lid section being engaged with each other in a state where the lens holder and the sealing section are in contact with each other,
    wherein the optical unit includes a pressing member fixed to the lens holder, and a supporting section supporting the pressing member, when the optical unit is fixed to the image sensing unit, the pressing member presses the lens holder to the transparent lid section, by which the lens holder is engaged with the transparent lid section.

2. The solid-state image sensing device as set forth in claim 1, wherein the lens and the lens holder are made of resin.

3. The solid-state image sensing device as set forth in claim 1, wherein the pressing section has an opening.

4. The solid-state image sensing device as set forth in claim 1, wherein:
    the lens is made of transparent resin, the lens holder is made of colored resin.

5. The solid-state image sensing device as set forth in claim 1, wherein:
the lens and the lens holder are made of transparent resin; and a surface of the lens holder is processed so that the surface blocks light.

6. The solid-state image sensing device as set forth in claim 1, wherein the optical unit is fixed to the image sensing unit by screwing the supporting section to the sealing section.

7. An electronic apparatus comprising a solid-state image sensing device, the solid-state image sensing device comprising:
an optical unit which includes a lens for guiding light from outside to a receiving surface of a solid-state image sensor and a lens holder for holding the lens therein; and
an image sensing unit which includes the solid-state image sensor and a transparent lid section arranged so as to face the receiving surface of the solid-state image sensor with a space therebetween,
the lens holder being engaged with a whole periphery part of the transparent lid section,
the image sensing unit including a sealing section which seals the image sensing unit with resin but does not seal the optical unit with resin in such a manner that an engaging section of the transparent lid section and the lens holder is not sealed,
the lens holder and the transparent lid section being engaged with each other in a state where the lens holder and the sealing section are in contact with each other,
wherein the optical unit includes a pressing member fixed to the lens holder, and a supporting section supporting the pressing member, when the optical unit is fixed to the image sensing unit, the pressing member presses the lens holder to the transparent lid section, by which the lens holder is engaged with the transparent lid section.

\* \* \* \* \*